(12) United States Patent
Chih et al.

(10) Patent No.: US 11,327,860 B2
(45) Date of Patent: May 10, 2022

(54) MEMORY DEVICE AND METHODS FOR PROGRAMMING AND READING MEMORY DEVICE

(71) Applicant: Taiwan Semiconductor Manufacturing Co., Ltd., Hsinchu (TW)

(72) Inventors: Yu-Der Chih, Hsin-Chu (TW); Jonathan Tsung-Yung Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 275 days.

(21) Appl. No.: 16/787,026

(22) Filed: Feb. 11, 2020

(65) Prior Publication Data

US 2021/0248048 A1 Aug. 12, 2021

(51) Int. Cl.
*G06F 11/20* (2006.01)
*G11C 17/18* (2006.01)
*G11C 17/16* (2006.01)

(52) U.S. Cl.
CPC .......... *G06F 11/2094* (2013.01); *G11C 17/16* (2013.01); *G11C 17/18* (2013.01); *G06F 2201/82* (2013.01)

(58) Field of Classification Search
CPC . G06F 11/2094; G06F 2201/82; G11C 17/16; G11C 17/18
USPC ...................................................... 714/6.13
See application file for complete search history.

(56) References Cited

U.S. PATENT DOCUMENTS

| 9,760,311 | B1 * | 9/2017 | Amir | G06F 3/0616 |
| 2007/0036007 | A1 * | 2/2007 | Lann | G11C 16/28 |
| | | | | 365/189.09 |
| 2009/0113116 | A1 * | 4/2009 | Thompson | G06K 17/0006 |
| | | | | 711/103 |
| 2012/0194222 | A1 * | 8/2012 | Hoefler | H03K 3/356182 |
| | | | | 327/57 |
| 2014/0140162 | A1 * | 5/2014 | Kim | G11C 29/789 |
| | | | | 365/230.01 |
| 2017/0053716 | A1 * | 2/2017 | Kim | G11C 29/24 |
| 2020/0219570 | A1 * | 7/2020 | Ha | G11C 17/18 |

FOREIGN PATENT DOCUMENTS

CN 105336375 A * 2/2016

* cited by examiner

*Primary Examiner* — Chae M Ko
(74) *Attorney, Agent, or Firm* — JCIPRNET

(57) ABSTRACT

A memory device and methods for programming and reading a memory device are provided. The memory device includes a memory array and a memory controller. The memory array includes a plurality of one-time programmable (OTP) cells, in which the OTP cells comprises a plurality of data cells for storing data, a plurality of supplementary cells in parallel to the data cells, and one or more redundant cells for each of a plurality of sets of the data cells. The memory controller is configured to program the data cells. The memory controller verifies and records a state of each data cell in a set of the data cells in the corresponding supplementary cell after the programming, and stores the data to be programmed to the data cell using the one or more redundant cells reserved for the set of the data cells when the data cell is verified as failed.

20 Claims, 6 Drawing Sheets

| Cell | Cell_B | Data/State |
|---|---|---|
| 0 | 0 | 0 |
| 1 | 0 | 1 |
| 0 | 1 | Failed |
| 1 | 1 | Tampered |

| Cell | 0 | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|
| Data | 0 | 1 | 2 | 3 | 4 | X | N | N | N | N | N | N | N | N | N | N | N | N |
| Data | 0 | 1 | 2 | 3 | 4 | X | 5 | N | N | N | N | N | N | N | N | N | N | N |
| Data | 0 | 1 | 2 | 3 | 4 | X | 5 | 6 | 7 | 8 | 9 | 10 | 11 | 12 | X | N | N | N |
| Data | 0 | 1 | 2 | 3 | 4 | X | 5 | 6 | 7 | 8 | 9 | 10 | 11 | 12 | X | 13 | 14 | 15 |

Redundant bits: cells 15, 16, 17

FIG. 7

MEMORY DEVICE AND METHODS FOR PROGRAMMING AND READING MEMORY DEVICE

BACKGROUND

One-time programmable (OTP) memory is widely used to provide chip identifications (IDs) or operation parameters, and used to configure or repair a chip. The OTP memory cells are typically implemented by antifuse, which relies on breakdown of metal-insulator-metal or diode structures to create two resistance states. A normal state of an antifuse element is an open state (i.e. an open circuit) and is transferred to a closed state when the antifuse element is blown. The antifuse element can thus be used to establish a logic level whose value depends upon whether it is blown or left in its normal state.

However, an antifuse element requires excessive voltages and currents (e.g., potentials exceeding 10 volts at currents greater than 10 Amps) for reliable programming, which may damage the surroundings. Thus, a portion of the array of cells in the OTP memory reserved for the programming by end users may have a high failure rate in the end applications, which may cause field return.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a table illustrating the programming operation in a memory device according to an embodiment of the disclosure.

DESCRIPTION OF THE EMBODIMENTS

Figures 1, 2:
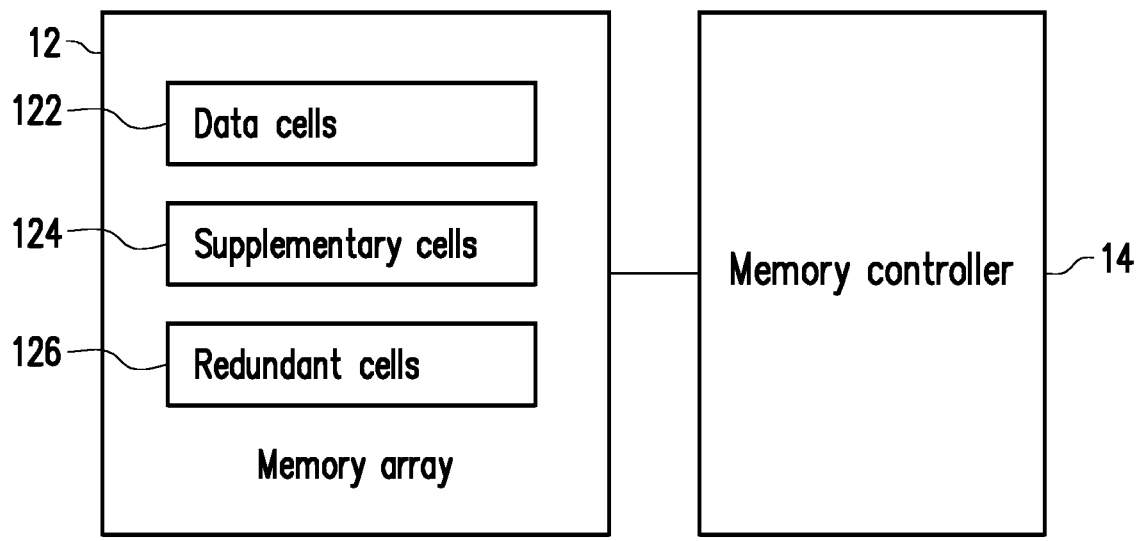
FIG. 1 illustrates a block diagram of a memory device according to an exemplary embodiment of the disclosure.
FIG. 2 is a table illustrating the data or states represented by the pair of OTP cells according to an embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a block diagram of a memory device according to an exemplary embodiment of the disclosure. Referring to FIG. 1, a memory device 10 includes a memory array 12 and a memory controller 14.

The memory device 10 is, for example, one-time programmable (OTP) memory. In some embodiments, the memory device 10 is antifuse, eFuse, floating-gate OTP memory, flash memory, magnetoresistive random access memory (MRAM), parameter random access memory (PRAM), phase-change random access memory (PCRAM), or any types of non-volatile memory (NVM).

The memory array 12 comprises a plurality of one-time programmable (OTP) cells, in which the OTP cells comprises a plurality of data cells 122 for storing data, a plurality of supplementary cells 124 in parallel to the data cells 122. The data cells 122 may be divided into a plurality of sets of data cells, and one or more redundant cells 126 are reserved for each of the plurality of sets of data cells.

The memory controller 14 is, for example, central processing unit (CPU), or other programmable general-purpose or specific-purpose microprocessor, microcontroller (MCU), programmable controller, application specific integrated circuits (ASIC), programmable logic device (PLD) or other similar devices or a combination of these devices; the embodiment provides no limitation thereto. In the present embodiment, the processor 34 is configured to program and read the data cells 122.

In this disclosure, each "bit" of data is given with more than two states. In some embodiments, a pair of OTP cells (e.g., cell/cell_B) is used store "data" and its "supplementary data" which is configured for tamper event detection. Accordingly, the pair of OTP cells can represent four states. FIG. 2 is a table illustrating the data or states represented by the pair of OTP cells according to an embodiment of the disclosure. Referring to FIG. 2, a cell is used for storing one bit of data while a cell_B is used for storing one bit of supplementary data. An initial state of the cell/cell_B is an open state which represents data of "0", and can be transferred into a closed state which represents data of "1" when being programmed. Accordingly, four data/states can be represented by the data stored in the cell and the cell_B.

In case the data of "0" is to be stored to the cell, no programming is performed since the initial state of the cell represents data of "0". In case the data of "1" is to be stored to the cell, the cell is then verified as whether the programming fails. If the data stored in the cell is verified as "0", it is determined the programming fails and the cell is verified as failed. Accordingly, the data of "1" is stored to the cell_B. If the data stored in the cell is verified as "1", it is determined the programming succeeds and the data of "0" is stored to the cell_B, which means no programming is performed since the initial state of the cell_B represents the data of "0". In case the cell is programmed to store data of "1", when a tamper event is detected, the data of "1" is stored to the cell_B, which represents the cell is tampered.

Based on the data/state storage scheme described above, a method for programming the memory device is provided for reducing the failure rate.

Figure 3:
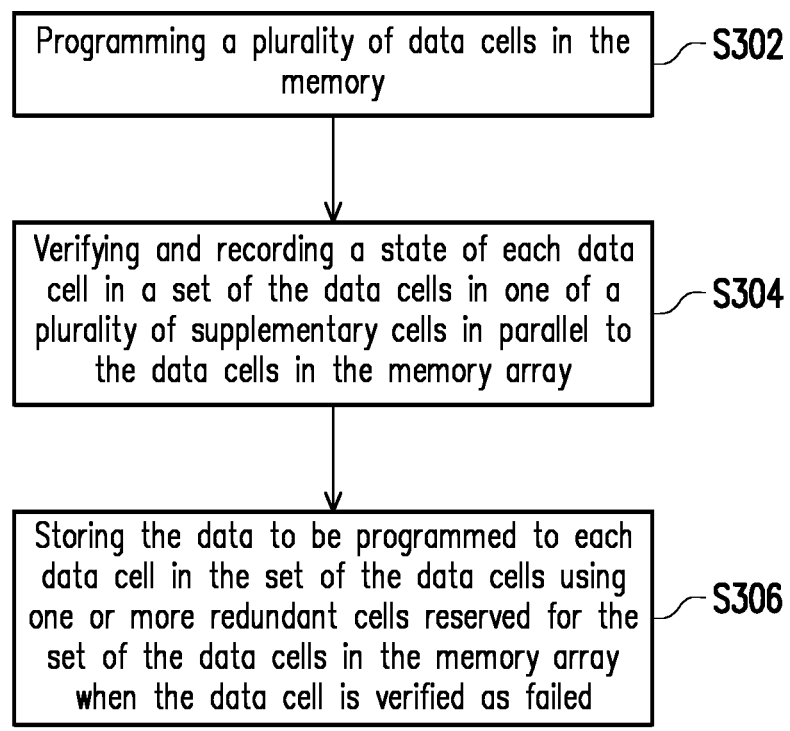
FIG. 3 is a flow chart of a method for programming a memory device according to an embodiment of the disclosure.

FIG. 3 is a flow chart of a method for programming a memory device according to an embodiment of the disclosure. Referring to FIG. 1 and FIG. 3, the method of the present embodiment is adapted for the above-mentioned memory device 10, and the detailed steps of the method will be described below with reference to various components of the memory device 10.

In step S302, the memory controller 14 programs a plurality of data cells 122 in the memory array 12. In some embodiments, the memory controller 14 applies a program voltage to blow an antifuse in the data cells 122 so as to program the data cells 122.

In step S304, the memory controller 14 verifies and records a state of each data cell 122 in a set of the data cells 122 in one of the supplementary cells 124 in parallel to the data cells 122 in the memory array 12. The memory controller 14 verifies the data cell 122 as failed when verifying a current state of the data cell 122 is in the open state after programming the data cell 122. In some embodiments, the data cells 122 are verified in a unit of eight words (i.e. 128 bits). That is, each set of the data cells 122 is configured to store data of eight words, and a same number of supplementary cells 124 are configured to store the verified states.

In step S306, the memory controller 14 stores the data to be programmed to each data cell 122 in the set of the data cells 122 using one or more redundant cells 126 reserved for the set of the data cells 122 in the memory array 12 when the data cell 122 is verified as failed. The memory controller 14 may adopt a replacement scheme or a shifter scheme to take use of the redundant cells to compensate for the failed cells, which are respectively described in detail below.

Through recording the states of data cells 122 in the corresponding supplementary cells 124 and reserving redundant cells to accommodate the data to be stored, the data can be correctly read out from the normal data cells and the redundant cells according to the recorded states, and thus a failure rate of the memory device 10 in the end applications (i.e. programmed by an end user) can be reduced.

In some embodiments, the replacement scheme is provided for repair data loss of the memory device. That is, the memory controller 14 stores the data to be programmed to the data cell 122 verified as failed in one of the redundant cells 126 for the corresponding set of the data cells 122. In case the data is protected by using error-correcting code (ECC), the data is decoded/encoded in a unit of "one word" (i.e. 16 bits) together with one parity bit, and therefore one redundant cell used to replace a failed cell is reserved for each word of the data cells. In case the failure rate is low, one redundant cell used to replace a failed cell is reserved for a row of the data cells that stores eight or more words of data so to save storage space. However, the disclosure is not limited thereto.

Figure 4:
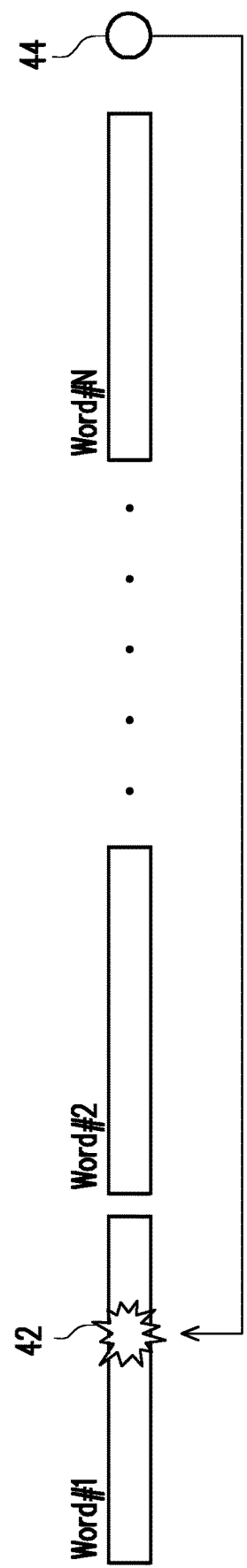
FIG. 4 is a schematic diagram illustrating a method for programming a memory device according to an embodiment of the disclosure.

For example, FIG. 4 is a schematic diagram illustrating a method for programming a memory device according to an embodiment of the disclosure. Referring to FIG. 4, the memory cells in a memory device are verified by rows, in which each row includes N words (i.e. word #1 to word #N) and a redundant cell 44 is reserved for the row of memory cells. When a cell 42 in word #1 is verified as failed, the state of cell 42 is recorded in a corresponding supplementary cell (not shown) and the data to be stored to the cell 42 is stored to the redundant cell 44. As a result, the data bit as well as the redundant bit can be read out at the same time, and the failed bit can be repaired on the fly with very minor impact to the read latency.

Figure 5:
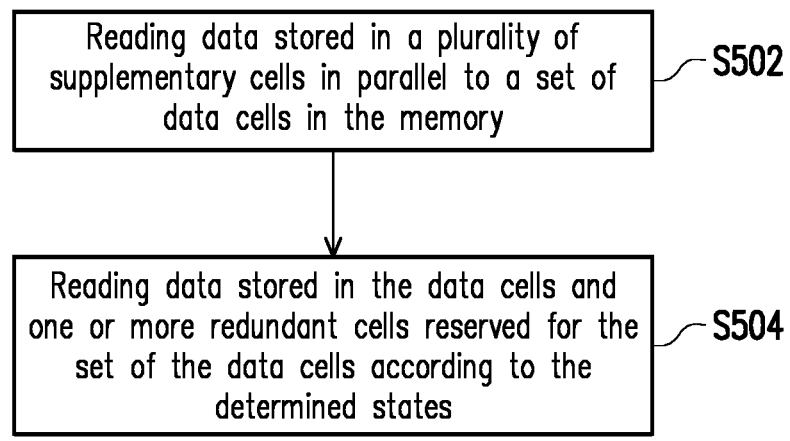
FIG. 5 is a flow chart of a method for reading a memory device according to an embodiment of the disclosure.

FIG. 5 is a flow chart of a method for reading a memory device according to an embodiment of the disclosure. Referring to FIG. 1 and FIG. 5, the method of the present embodiment is adapted for the above-mentioned memory device 10, and the detailed steps of the method will be described below with reference to various components of the memory device 10.

In step S502, the memory controller 14 reads data stored in a plurality of supplementary cells 124 in parallel to a set of data cells 122 in the memory array 12 to determine states of the data cells 122.

In step S504, the memory controller 14 reads data stored in the data cells 122 and one or more redundant cells 126 reserved for the set of the data cells 122 according to the determined states. In some embodiments, if the data cell 122 being read is in the open state and the corresponding supplementary cell 126 is in the closed state, the data stored in the redundant cells 126 is read in replacement of the data stored in the data cell 122 according to the replacement scheme. In some embodiments, if the data cell 122 being read is in the open state and the corresponding supplementary cell 126 is in the closed state, the data stored in a next data cell is read in replacement of the data stored in the data cell 122 according to the shifter scheme.

Figure 6:
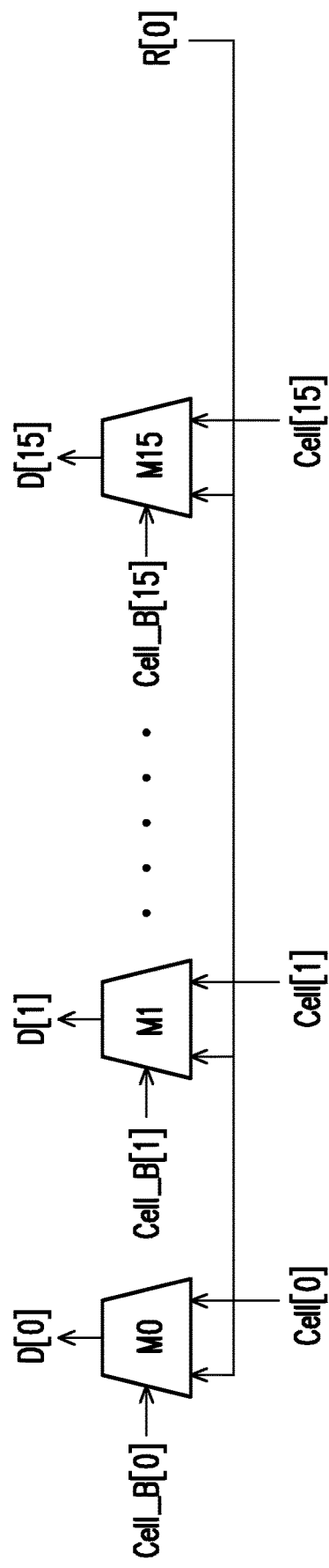
FIG. 6 is a circuit in a memory controller for reading a memory device according to an embodiment of the disclosure.

FIG. 6 is a circuit in a memory controller for reading a memory device according to an embodiment of the disclosure. Referring to FIG. 6, in the present embodiment, one redundant cell is reserved per word (i.e. 16 data cells), and a circuit 60 in the memory controller comprises a plurality of multiplexers M0 to M15 which are respectively connected to the data cells Cell[0] to Cell[15] to read data and connected to the redundant cell R[0] to read data. The multiplexers M0 to M15 are also respectively connected to the corresponding supplementary cells Cell_B[0] to Cell_B[15] to read data, and accordingly selects data read form one of the data cells Cell[0] to Cell[15] and the data read from the redundant cell R[0] to be the output data D[0] to D[15].

For example, the multiplexer M0 selects the data read from one of the data cell Cell[0] and the redundant cell R[0] according to the state of the data cell determined from the data read from the corresponding supplementary cell Cell_B[0]. If the data read from the data cell Cell[0] is in the open state or the closed state and the data read from the corresponding supplementary cell Cell_B[0] is in the open state, the multiplexer M0 selects the data read from the data cell Cell[0] as the output data D[0]. If the data read from the data cell Cell[0] is in the open state and the data read from the corresponding supplementary cell Cell_B[0] is in the closed state, the multiplexer M0 selects the data read from the redundant cell R[0] as the output data D[0]. It is noted if the data read from the data cell Cell[0] is in the closed state (i.e. cannot pass an initial read) and the data read from the corresponding supplementary cell Cell_B[0] is in the closed state, the multiplexer M0 determines the data cell Cell[0] is tampered.

In some embodiments, the shifter scheme is provided for repair data loss of the memory device. That is, the memory controller 14 stores the data to be programmed to the data cell 122 verified as failed in a next data cell 122 in the corresponding set of data cells 122, and shifts to store the data in following data cells 122 and the one or more redundant cells 126 of the corresponding set of the data cells 122.

FIG. 7 is a table illustrating the programming operation in a memory device according to an embodiment of the disclosure. Referring to FIG. 7, two redundant cells are reserved per word (i.e. 16 data cells) and the programming operation is divided into four stages. At first stage, the memory controller of the memory device sequentially programming the data cells in the memory array from Cell 0 to Cell 5. During the programming operation, the memory controller verifies a state of each data cell and records the verified state in the corresponding supplementary cell (not shown). The memory controller verifies the state of Cell 5 as failed and therefore records the state of Cell 5 as failed (marked as X in the table) in the corresponding supplementary cell. At second stage, the memory controller stores the data to be programmed to Cell 5 in Cell 6 next to Cell 5. At third stage, the memory controller shifts to store the data in following Cell 6 to Cell 14. The memory controller verifies the state of Cell 14 as failed and therefore records the state of Cell 14 as failed (marked as X in the table) in the corresponding supplementary cell. At fourth stage, the memory controller stores the data to be programmed to Cell 14, which is the data to be programmed to Cell 13 since the data to be stored is shifted, in Cell 15 next to Cell 14, and shifts to store the data in following Cell 16 to Cell 17.

On the other hand, when reading the memory device, the memory controller first reads the data stored in the supplementary cells in parallel to Cell 0 to Cell 17 to determine the states of the Cell 0 to Cell 17. Then, the memory controller reads the data stored in Cell 0 to Cell 17 according to the determined states.

In details, at first stage, the memory controller sequentially reads the data stored in the supplementary cells in parallel to Cell 0 to Cell 4 to determine Cell 0 to Cell 4 are in the normal state and accordingly reads the data stored in Cell 0 to Cell 4. Then, the memory controller reads the data stored in the supplementary cells in parallel to Cell 5 to determine Cell 5 are in the failed state, and accordingly stops to read the data stored in Cell 5. At second stage, the memory controller reads the data stored in the supplementary cells in parallel to Cell 6 to determine Cell 6 are in the normal state, and accordingly shifts to read the data stored in Cell 6 as the data of Cell 5. At third stage, the memory controller sequentially reads the data stored in the supplementary cells in parallel to Cell 7 to Cell 13 to determine Cell 7 to Cell 13 are in the normal state and accordingly reads the data stored in Cell 7 to Cell 13 as the data of Cell 6 to Cell 12. Then, the memory controller reads the data stored in the supplementary cells in parallel to Cell 14 to determine Cell 14 are in the failed state, and accordingly stops to read the data stored in Cell 14. At fourth stage, the memory controller reads the data stored in the supplementary cells in parallel to Cell 15 to Cell 17 to determine Cell 15 to Cell 17 are in the normal state, and accordingly shifts to read the data stored in Cell 15 to Cell 17 as the data of Cell 13 to Cell 15.

It is noted that in the above embodiment, the Cell 16 and Cell 17 are redundant cells reserved for the data cells (i.e. Cell 0 to Cell 15), and if one more data cell is verified as failed, there would be no redundant cell to store the correct data. On the contrary, if there are too many redundant cells reserved for the data cells and there are few data cells verified as failed, the over reserved redundant cells cause waste of storage space of the memory device. Therefore, in some embodiments, the number of redundant cells reserved for the data cells is determined according to a failure rate of the data cells of the memory device.

According to some embodiments of the disclosure, a memory device comprises a memory array and a memory controller. The memory array comprises a plurality of one-time programmable (OTP) cells, wherein the OTP cells comprises a plurality of data cells for storing data, a plurality of supplementary cells in parallel to the data cells, and one or more redundant cells for each of a plurality of sets of the data cells. The memory controller is configured to program the data cells. The memory controller verifies and records a state of each data cell in a set of the data cells in the corresponding supplementary cell after the programming, and stores the data to be programmed to the data cell using the one or more redundant cells reserved for the set of the data cells when the data cell is verified as failed.

According to some embodiments of the disclosure, a method for programming a memory device comprising a memory array having a plurality of OTP cells and a memory controller includes steps of: programming a plurality of data cells in the memory array; verifying and recording a state of each data cell in a set of the data cells in one of a plurality of supplementary cells in parallel to the data cells in the memory array; and storing the data to be programmed to each data cell in the set of the data cells using one or more redundant cells reserved for the set of the data cells in the memory array when the data cell is verified as failed.

According to some embodiments of the disclosure, a method for reading a memory device comprising a memory array having a plurality of OTP cells and a memory controller includes steps of: reading data stored in a plurality of supplementary cells in parallel to a set of data cells in the memory array to determine states of the data cells; and reading data stored in the data cells and one or more redundant cells reserved for the set of the data cells according to the determined states, wherein if the data cell being read is in the open state and the corresponding supplementary cell is in the closed state, the data stored in one of other data cells and the redundant cells is read in replacement of the data stored in the data cell.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory device, comprising:
a memory array comprising a plurality of one-time programmable (OTP) cells, wherein the OTP cells comprises a plurality of data cells for storing data, a plurality of supplementary cells in parallel to the data cells, and one or more redundant cells for each of a plurality of sets of the data cells; and
a memory controller, configured to program the data cells, wherein
the memory controller verifies and records a state of each data cell in a set of the data cells in the corresponding supplementary cell after the programming, and stores the data to be programmed to the data cell using the one or more redundant cells reserved for the set of the data cells when the data cell is verified as failed.

2. The memory device of claim 1, wherein each of the OTP cells is an antifuse with an open state as an initial state and transferred into a closed state when being programmed.

3. The memory device of claim 2, wherein the memory controller verifies the data cell as failed when verifying a current state of the data cell is in the open state after programming the data cell.

4. The memory device of claim 1, wherein the memory controller comprises storing the data to be programmed to the data cell verified as failed in one of the redundant cells for the corresponding set of the data cells.

5. The memory device of claim 4, wherein the memory controller further comprises:
a plurality of multiplexers connected to the set of data cells, and configured to determine states of the data cells recorded in the corresponding supplementary cells and output the data stored in the redundant cell in replacement of the data stored in the data cell as read data if the data cell is in the open state and the corresponding supplementary cell is in the closed state.

6. The memory device of claim 4, wherein the memory controller comprises determining the data stored in the data cell is tampered if the data cell and the corresponding supplementary cell are both in the closed state.

7. The memory device of claim 1, wherein the memory controller comprises storing the data to be programmed to the data cell verified as failed in a next data cell in the corresponding set of data cells, and shifting to store the data in following data cells and the one or more redundant cells of the corresponding set of the data cells.

8. The memory device of claim 7, wherein the memory controller comprises shifting to read the data stored in the next data cell in replacement of the data stored in the data cell if the data cell is in the open state and the corresponding supplementary cell is in the closed state.

9. The memory device of claim 1, wherein one redundant cell is reserved for a row of the data cells for storing eight words of data.

10. The memory device of claim 1, wherein a number of the redundant cells reserved for each set of the data cells is determined according to a failure rate.

11. A method for programming a memory device comprising a memory array having a plurality of OTP cells and a memory controller, the method comprises:
programming a plurality of data cells in the memory array;
verifying and recording a state of each data cell in a set of the data cells in one of a plurality of supplementary cells in parallel to the data cells in the memory array; and
storing the data to be programmed to each data cell in the set of the data cells using one or more redundant cells reserved for the set of the data cells in the memory array when the data cell is verified as failed.

12. The method of claim 11, wherein each of the OTP cells is an antifuse with an open state as an initial state and transferred into a closed state when being programmed.

13. The method of claim 12, wherein verifying the state of each data cell comprises:
verifying the data cell as failed when verifying a current state of the data cell is in the open state after programming the data cell.

14. The method of claim 11, wherein storing the data to be programmed to each data cell in the set of the data cells using one or more redundant cells comprises:
storing the data to be programmed to the data cell verified as failed in one of the redundant cells for the corresponding set of the data cells.

15. The method of claim 11, wherein storing the data to be programmed to each data cell in the set of the data cells using one or more redundant cells comprises:
storing the data to be programmed to the data cell verified as failed in a next data cell in the corresponding set of data cells, and shifting to store the data in following data cells and the one or more redundant cells of the corresponding set of the data cells.

16. The method of claim 11, wherein one redundant cell is reserved for a row of the data cells for storing eight words of data.

17. The method of claim 11, further comprising:
determining a number of the redundant cells reserved for each set of the data cells according to a failure rate.

18. A method for reading a memory device comprising a memory array having a plurality of OTP cells and a memory controller, the method comprises:
reading data stored in a plurality of supplementary cells in parallel to a set of data cells in the memory array to determine states of the data cells; and
reading data stored in the data cells and one or more redundant cells reserved for the set of the data cells according to the determined states, wherein
if the data cell being read is in the open state and the corresponding supplementary cell is in the closed state, the data stored in one of other data cells and the redundant cells is read in replacement of the data stored in the data cell.

19. The method of claim 18, wherein reading data stored in the data cells and one or more redundant cells comprises:
reading the data stored in one of the redundant cells reserved for the set of the data cells in replacement of the data stored in the data cell if the data cell is in the open state and the corresponding supplementary cell is in the closed state.

20. The method of claim 18, wherein reading data stored in the data cells and one or more redundant cells comprises:
shifting to read the data stored in a next data cell of the data cell in replacement of the data stored in the data cell if the data cell is in the open state and the corresponding supplementary cell is in the closed state.

* * * * *